United States Patent
Tandon et al.

(10) Patent No.: US 6,730,944 B1
(45) Date of Patent: May 4, 2004

(54) INP BASED HIGH TEMPERATURE LASERS WITH INASP QUANTUM WELL LAYERS AND BARRIER LAYERS OF $GA_x(ALIN)_{1-x}P$

(75) Inventors: Ashish Tandon, Sunnyvale, CA (US); Ying-Ian Chang, Cupertino, CA (US); Scott W. Corzine, Sunnyvale, CA (US); David P. Bour, Cupertino, CA (US); Michael R. T. Tan, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/354,276

(22) Filed: Jan. 30, 2003

(51) Int. Cl.[7] .................. H01L 29/06; H01L 33/00; H01L 21/00; H01S 5/00
(52) U.S. Cl. .................. 257/103; 257/14; 257/94; 257/96; 372/43; 372/44; 372/45; 372/46; 438/44; 438/46; 438/47
(58) Field of Search .................. 257/12–14, 94–96, 257/103; 372/43–46; 438/44, 46–47

(56) References Cited

U.S. PATENT DOCUMENTS 5,753,933 A * 5/1998 Morimoto .................. 257/14
2003/0155625 A1 * 8/2003 Kato et al. .................. 257/432

* cited by examiner

Primary Examiner—Donghee Kang
(74) Attorney, Agent, or Firm—Ian Hardcastle

(57) ABSTRACT

The invention provides a laser structure that operates at a wavelength of 1.3 μm and at elevated temperatures and a method of making same. The laser structure includes a quantum well layer of InAsP. The quantum well layer is sandwiched between a first barrier layer and a second barrier layer. Each barrier layer exhibits a higher bandgap energy than the quantum well layer. Also, each barrier layer comprises $Ga_x(AlIn)_{1-x}P$ in which x 0. This material has a higher bandgap energy than conventional barrier layer materials, such as InGaP. The resulting larger conduction band discontinuity leads to improved high temperature performance without increasing the threshold current of the laser structure.

13 Claims, 4 Drawing Sheets

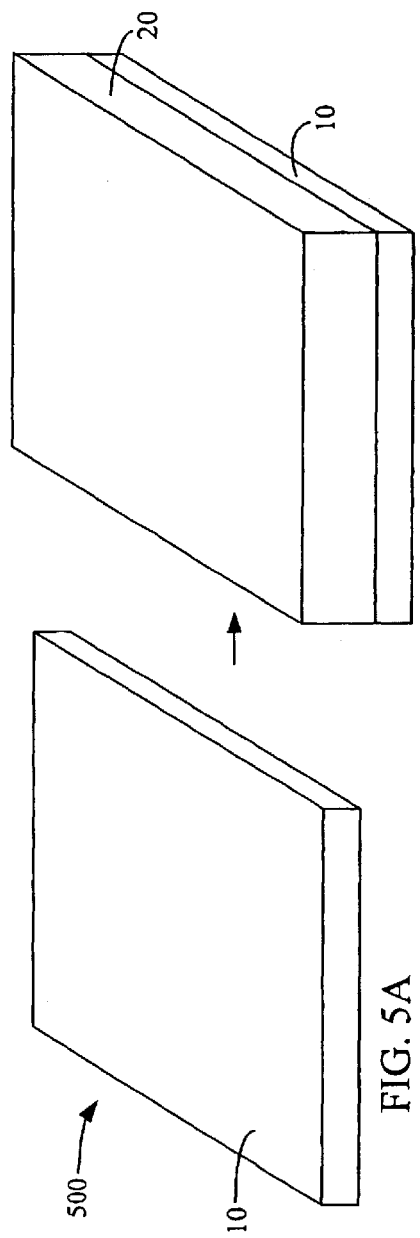
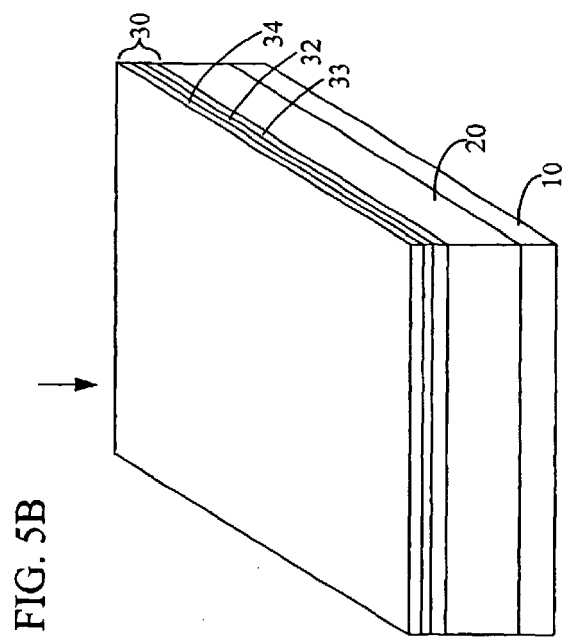
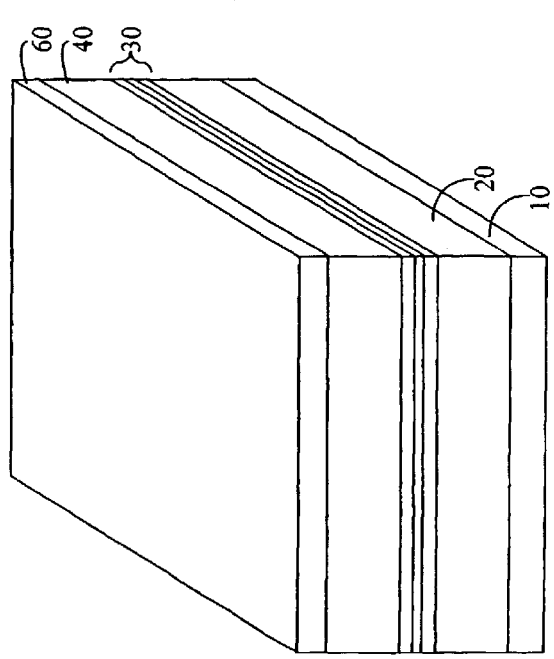
FIG. 5A
FIG. 5B
FIG. 5C
FIG. 5D

INP BASED HIGH TEMPERATURE LASERS WITH INASP QUANTUM WELL LAYERS AND BARRIER LAYERS OF GA$_x$(ALIN)$_{1-x}$P

FIELD OF THE INVENTION

The present invention is generally related to light-emitting devices and, more particularly, to semiconductor lasers.

DESCRIPTION OF THE RELATED ART

The major approach for fabrication of semiconductor lasers operating at a wavelength of 1.3 µm involves the use of strained InAsP multiple quantum wells grown on InP substrates. As for any semiconductor laser, one of the factors that determines the performance of the device is the sensitivity of threshold current to temperature.

The threshold current and emission efficiency of conventional lasers on Inp substrates strongly depend on operating temperature. Specifically, threshold current $I_{th}$ is defined by the following equation:

$$I_{th} = I_o \exp(T/T_o) \qquad \text{(Equation 1)}$$

where $I_o$ is a constant, T is the operating temperature, and $T_o$ is the characteristic temperature. As shown in Equation 1, the threshold current $I_{th}$ increases exponentially with temperature ratio $T/T_o$. Accordingly, if $T_o$ is a very high value, the threshold current $I_{th}$ is fairly insensitive to temperature T changes. Therefore, to realize good high temperature performance in lasers, temperature-insensitive characteristics with a high characteristic temperature $T_o$ are desired.

For the conventional InAsP active region, the temperature performance is limited by the poor electron confinement due to a small conduction band offset between the InAsP of the quantum well (QW) layers and the material of the barrier layers. The performance of these lasers at elevated temperatures is therefore unsatisfactory.

For example, two of the common choices for the barrier material for the InAsP active region are InGaP and AlInGaAs. Although lasers with InAsP QW layers and InGaP barrier layers have low threshold currents, these lasers exhibit poor performance at higher temperatures. Note there is significant amount of disagreement in the scientific community regarding the conduction band discontinuity between InAsP and InGaP.

Lasers with InAsP QW(s) layers and AlInGaAs barrier layers have a higher threshold current than their InAsP/InGaP counterparts but have better characteristics at high temperatures. This may be explained by the existence of defects at the InAsP/AlInGaAs interface. For example, defects which act as non-radiative centers in the QW(s) layers or barrier layers can increase the threshold current and lead to a higher $T_o$.

The quality of an epitaxially regrown layer of InAsP also generally improves as the growth temperature is reduced. Therefore, active regions with InAsP QW layers are grown at relatively low temperatures. This low growth temperature, however, does not produce high-quality AlInGaAs barrier layers on the InAsP QW layer material, since the AlInGaAs barrier material requires a higher growth temperature for better crystal quality.

Consequently, the InGaP and AlInGaAs barrier layer materials for InAsP QW layers do not provide desired low threshold currents and high temperature laser performance. Thus, a heretofore unaddressed need exists in the industry to address the aforementioned deficiencies and inadequacies.

SUMMARY OF THE INVENTION

The present invention provides a laser structure that operates at a wavelength of 1.3 µm at elevated temperatures and a method for fabricating such a laser structure. The laser structure includes a quantum well layer of InAsP. The quantum well layer is sandwiched between a first barrier layer and a second barrier layer. The material of each barrier layer exhibits a higher band gap energy than the material of the quantum well layer. Each barrier layer comprises Ga$_x$(AlIn)$_{1-x}$P in which x 0. This material has a higher bandgap energy than conventional barrier layer materials, such as InGaP. The resulting larger conduction band discontinuity leads to improved high temperature performance without increasing the threshold current of the laser structure.

The present invention also provides a method for fabricating a laser structure that operates at a wavelength of 1.3 µm and at elevated temperatures. The method includes providing a substrate of InP; forming a lower cladding layer over the substrate; forming a first barrier layer of Ga$_x$(AlIn)$_{1-x}$P in which x 0 over the lower cladding layer; forming a quantum well layer of InAsP over the first barrier layer, forming a second barrier layer of Ga$_x$(AlIn)$_{1-x}$P in which x 0 over the quantum well layer; and forming an upper cladding layer over the second barrier layer.

Other features and/or advantages of the present invention will be or become apparent to one with skill in the art upon examination of the following drawings and detailed description. It is intended that all such additional features and advantages be included within the description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 5A–5D are perspective views illustrating the process for fabricating the first embodiment of the laser structure shown in FIG. 1.

DETAILED DESCRIPTION

The present invention provides an improved laser structure that has good laser performance at long wavelengths and at elevated temperatures. This laser structure includes an active region in which are located InAsP quantum well (QW) layers with barrier layers of Ga$_x$(AlIn)$_{1-x}$P in which x 0. The invention provides a laser structure with InAsP QW layers and Ga$_x$(AlIn)$_{1-x}$P barrier layers that can be used to produce 1.3 µm lasers having temperature-insensitive characteristics.

Figure 1:
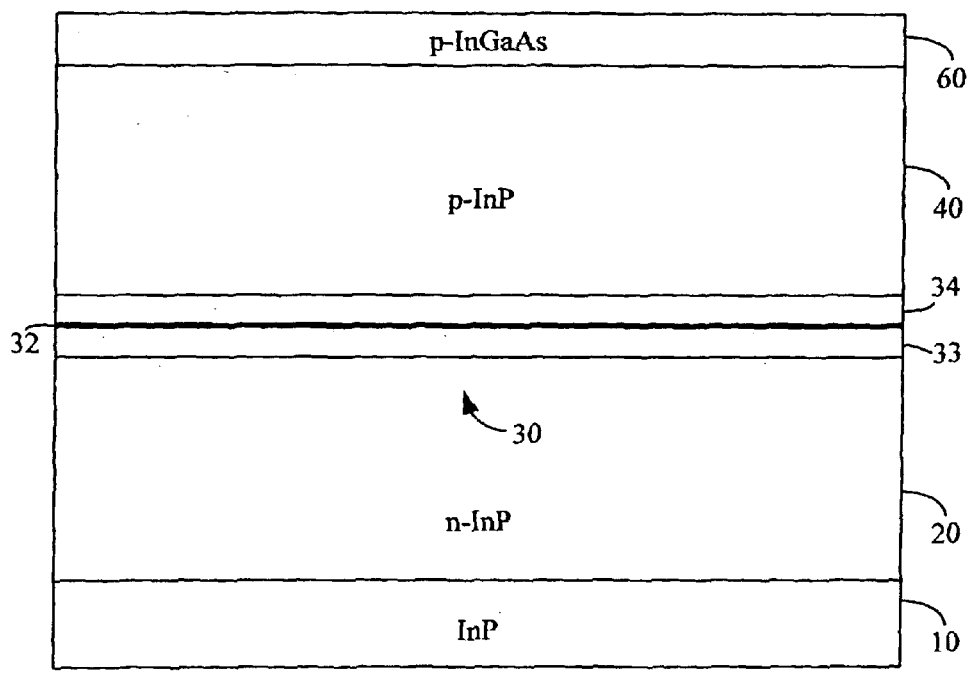
FIG. 1 is a cross-sectional view illustrating a first embodiment of a laser structure of the present invention.

As shown by FIG. 1, a first embodiment 100 of a laser structure includes an InP substrate 10. Epitaxially grown on the substrate are n-InP cladding layer 20, active region 30, p-InP cladding layer 40, and a p-InGaAs cap layer 60. The active region 30 includes a single quantum well structure. The single quantum well structure includes a strained quantum well (QW) heterostructure active layer 32 of InAsP. Flanking the InAsP QW layer 32 are barrier layers 33, 34. The barrier layers are composed of $Ga_x(AlIn)_{1-x}P$ in which $x \geq 0$. Note, in alternative embodiments, the active region 30 may include a multiple quantum well structure composed of n QW layers of InAsP and (n+1) barrier layers of $Ga_x(AlIn)_{1-x}P$ in which $x \geq 0$.

Figure 2:
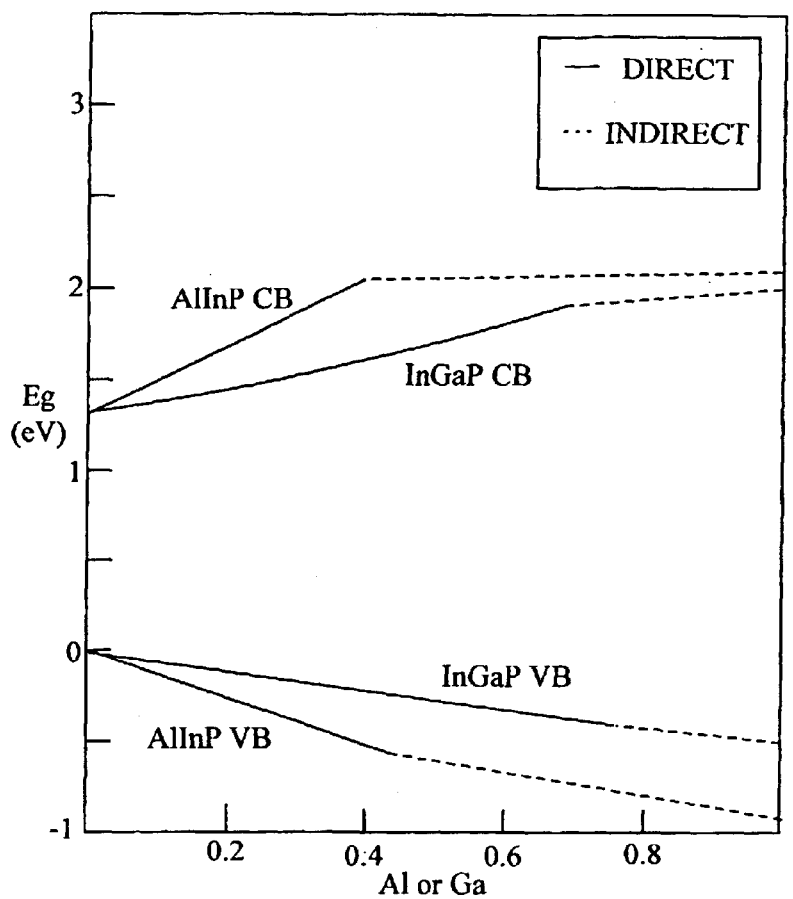
FIG. 2 is a graph comparing the dependence of band energies of fractional composition of barrier materials of the laser shown in FIG. 1 with InGaP barrier layer materials of the prior art.

Replacing some or all of the Ga in InGaP with Al leads to a larger conduction and valence band discontinuity between the material of the QW layer 32 and the material of the barrier layers 33, 34. For example, FIG. 2 shows the dependence of the band energies of strained InGaP on the Ga mole fraction and the band energies of AlInP (ie. $Ga_x(AlIn)_{1-x}P$ in which x=0) on the Al mole fraction. Particularly, FIG. 2 shows that the AlInP barrier layer material has a higher bandgap energy than the InGaP barrier layer material. Notably, in the material of the barrier layers 33, 34, a given Al mole fraction in AlInP produces a higher bandgap energy than does the same Ga mole fraction in InGaP. Consequently, a greater band offset is produced between the InAsP material of the QW layer 32 and the AlInP material of the barrier layers 33, 34. This greater band offset leads to improved high temperature performance without a significant increase in the laser threshold current.

Figure 3:
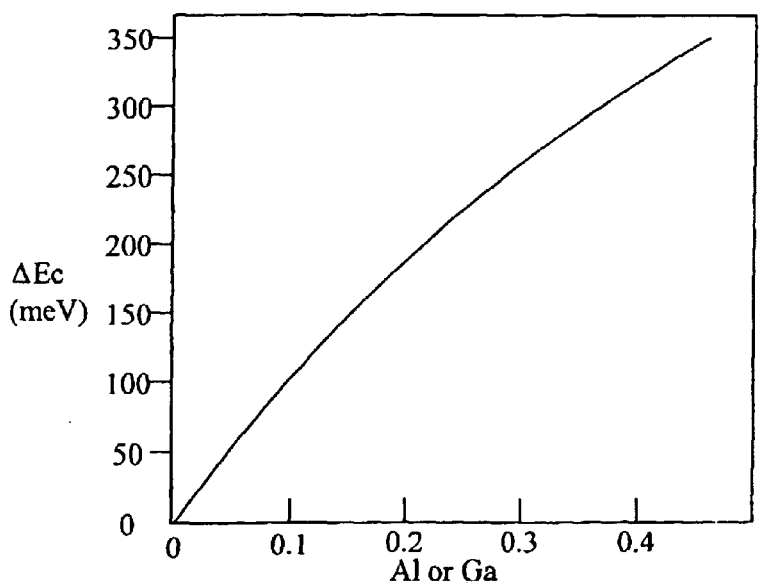
FIG. 3 is a graph of the dependence of the conduction band discontinuity on the fractional composition of the barrier layer materials of the laser in FIG. 1 with InGaP barrier layer materials of the prior art.
Figure 4:
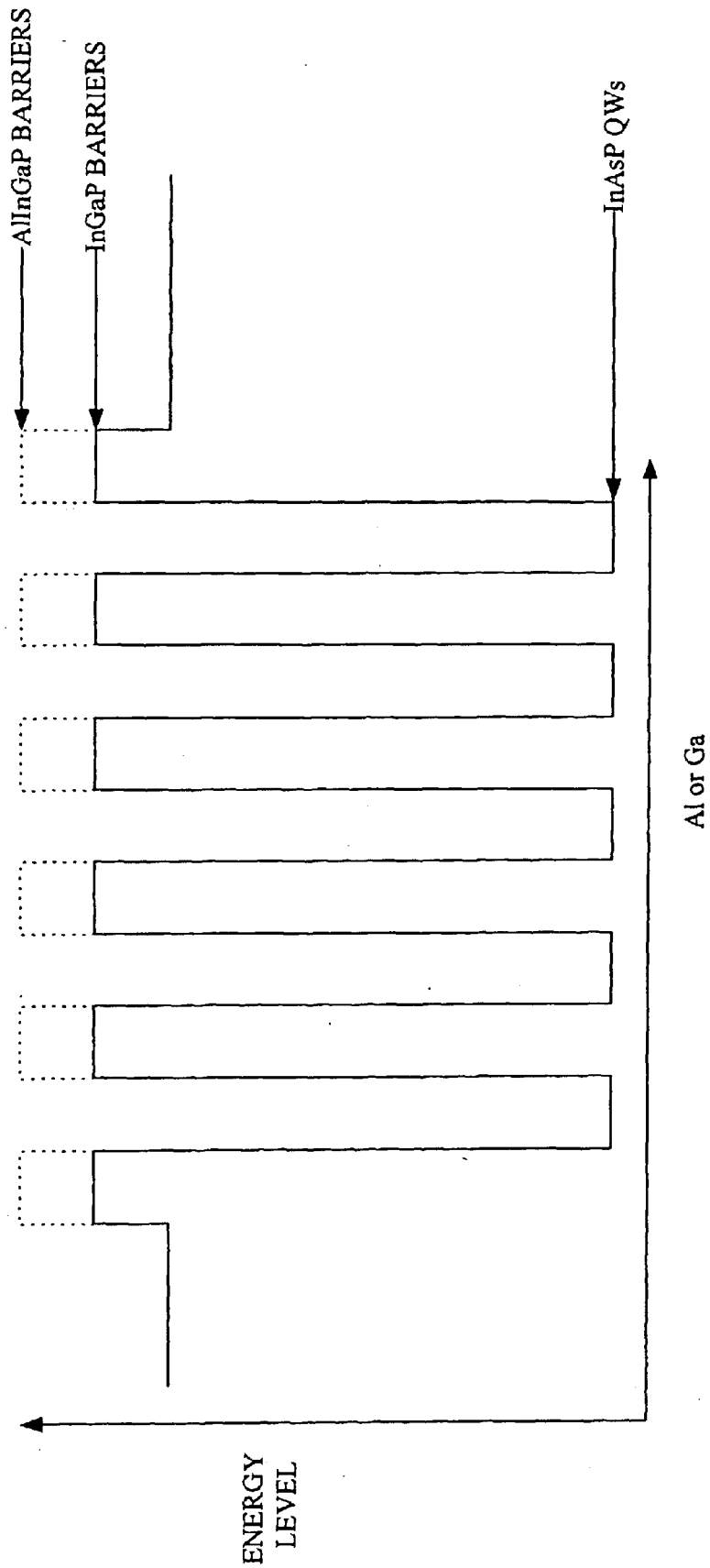
FIG. 4 is a graph comparing the energy levels of the AlInGaP barrier materials of one embodiment of the system in FIG. 1 with InGaP barrier materials of the prior art.

FIG. 3 depicts the conduction band discontinuity between unstrained InGaP as a function of Ga mole fraction and AlInP as a function of Al mole fraction. Particularly, the discontinuity represents the additional barrier to electrons in the InAsP QW layer 32 when the barrier layers 33, 34 are of AlInP having a given Al mole fraction instead of InGaP having the same Ga mole fraction. By replacing the Ga in InGaP with Al in the material of barrier layers 33, 34, the band energy of the barrier layers increases, as shown in FIG. 4. By increasing the band energy, carrier confinement provided by the barrier layers in the InAsP QW layer 32 is enhanced, and the high temperature performance is improved. Therefore, the laser structure 100 has superior temperature characteristics to conventional long wavelength sources.

In addition, unlike an AlInGaAs barrier layer material of the prior art, the AlInP material of the barrier layer 33, 34 contains phosphorus (P) and aluminum (Al). These constituents enable the barrier layer material to grow with a better crystalline quality at low growth temperatures than materials containing Al and arsenic (As). This characteristic may be attributed to the strong bonding properties of P (P being a smaller atom than As) to the reactive Al. As a result, Al compounds containing P have better crystal quality than Al compounds containing As (growth temperature and Al mole fraction remaining constant). Therefore, the use of AlInP instead of AlInGaAs as the material of the barrier layers 33, 34 in the active region 30 leads to superior quantum well layer to barrier layer interfaces and to better barrier layer material, in general. The improved crystal quality also leads to a lower threshold current.

Correspondingly, a barrier layer material of AlGaInP (ie. $Ga_x(AlIn)_{1-x}P$ in which x 1), is preferred for particular laser applications, since AlGaInP has a conduction band energy that lies between those of AlInP and InGaP. This results in a lower band offset relative to the material of QW layer 32 and provides better carrier distribution in the active region 30.

FIGS. 5A–5D illustrate one embodiment of a process 500 for fabricating the laser structure of the present invention. As depicted in FIG. 5A, a single crystal substrate 10 of InP is provided. On the substrate 10 of FIG. 5B, a 3 μm cladding layer 20 of n-InP (usually Si, Se or Te doped) is epitaxially grown at about 600° C. Next, in FIG. 5C, an active region 30 is grown on the cladding layer 20. This active region 30 is formed by growing a barrier layer 34 of $Ga_x(AlIn)_{1-x}P$ in which x 0; a quantum well layer 32 of InAsP; and another barrier layer 33 of $Ga_x(AlIn)_{1-x}P$ in which x 0. The InAsP QW layer and $Ga_x(AlIn)_{1-x}P$ barrier layers are usually grown at about 550° C. and each is about 10 nm thick. As depicted in FIG. 5D, a cladding layer 40 of p-InP is then grown over the active region 30. This cladding layer of p-InP 40 is usually 3 m thick and grown at about 600° C. Generally, the cladding layer of p-InP 40 uses Zn as a dopant. Finally, a cap layer 60 of p-InGaAs (Zn doped) is grown.

In alternative embodiments, the laser structure may inlcude waveguiding layers located on opposite sides of the active region. The waveguiding layers could be of InGaAsP or AlInGaAs.

The active region 30 may alternatively include a multiple quantum well structure comprising of additional quantum well layers and a corresponding number of barrier layers. Typically, InAsP QW layers are compressively strained when grown on an InP substrate. This compressive strain results in lower transparency and higher differential gain in lasers with InAsP QW layer(s). This has important implications for high efficiency and high speed devices. However, the amount of compressive strain in the lnAsP QW layers (typically about 1.25% strain for 40% As in the InAsP) limits the number of InAsP QW layers that can be added before reaching the strain limit of the InAsP QW material. Therefore to offset the compressive strain, the $Ga_x(AlIn)_{1-x}P$ used as the barrier layers 33, 34 may be tensile strained, where the amount of tensile strain can easily be varied by changing the relative compositions of In and Ga in $Ga_x(AlIn)_{1-x}P$. Typically 1% tensile strain is obtained for x=0.15 in the $Ga_x(AlIn)_{1-x}P$ of the barrier layers 32, 34.

It should be emphasized that the above-described embodiments of the present invention are merely possible examples of implementations, merely set forth to promote a clear understanding of the invention. Many variations and modifications may be made to the above-described embodiments of the invention without departing substantially from the principles of the invention. For example, it is contemplated that the layers outside the $InAsP/Ga_x(AlIn)_{1-x}P$ active region 30 of the laser structure may differ in number or composition from the examples shown. Additional fabrication processes may also be performed, such as etching and layer disordering. Consequently, many type of devices may be formed in accordance with the present invention. All such modifications and variations are intended to be included herein within the scope of this disclosure and the present invention and protected by the following claims.

We claim:

1. A laser structure operable at elevated temperatures, comprising:

a quantum well layer of InAsP, the quantum well layer sandwiched between a first barrier layer and a second barrier layer, the first and second barrier layers including $Ga_x(AlIn)_{1-x}P$ in which $x \geq 0$, the first and second barrier layers each exhibiting a higher bandgap energy than the quantum well layer.

2. The laser structure of claim 1, wherein x>0.

3. The laser structure of claim 2, further comprising:

a substrate located below the first cladding layer.

4. The laser structure of claim 3, wherein the substrate comprises InP.

5. The laser structure of claim 3, further comprising:
a cap layer located above the second cladding layer.

6. The laser structure of claim 5, wherein the cap layer comprises InGaAs.

7. The laser structure of claim 1, further comprising:
a first cladding layer located below the first barrier layer; and
a second cladding layer located above the second barrier layer.

8. A method for fabricating a laser structure operable at elevated temperatures, the method comprising:
providing a substrate;
forming a first cladding layer over the substrate;
forming a first barrier layer over the first cladding layer, the first barrier layer including $Ga_x(AlIn)_{1-x}P$ in which $x \geq 0$;
forming a quantum well layer of InAsP over the first barrier layer, the quantum well layer exhibiting a lower bandgap energy than the first barrier layer;
forming a second barrier layer over the quantum well layer, the second barrier layer including $Ga_x(AlIn)_{1-x}P$ in which $x \geq 0$, the second barrier layer exhibiting a higher bandgap energy than the quantum well layer; and
forming a second cladding layer over the second barrier layer.

9. The method of claim 8, wherein $x > 0$.

10. The method of claim 8, wherein the substrate comprises InP.

11. The method of claim 8, further comprising:
forming a second quantum well layer of InAsP over the second barrier layer, the second quantum well layer exhibiting a lower bandgap energy than the second barrier layer; and
forming a third barrier layer of $Ga_x(AlIn)_{1-x}P$ in which $x \geq 0$ over the second quantum well layer and below the second cladding layer, the third barrier layer exhibiting a higher bandgap energy than the second quantum well layer.

12. The method of claim 8, further comprising:
forming a cap layer over the second cladding layer.

13. The method of claim 12, wherein the cap layer comprises InGaAs.

* * * * *